(12) United States Patent
Cario et al.

(10) Patent No.: US 8,305,794 B2
(45) Date of Patent: Nov. 6, 2012

(54) USE OF LACUNAR SPINELS WITH TETRAHEDRAL AGGREGATES OF A TRANSITION ELEMENT OF THE $AM_4X_8$ TYPE WITH AN ELECTRONIC DATA REWRITABLE NON VOLATILE MEMORY, AND CORRESPONDING MATERIAL

(75) Inventors: Laurent Cario, Nantes (FR); Benoit Corraze, Carquefou (FR); Etienne Janod, La Chapelle sur Erdre (FR); George Christian Vaju, Nantes (FR); Marie-Paule Besland, Orvault (FR)

(73) Assignee: Universite De Nantes, Cedex (FR)

( * ) Notice: Subject to any disclaimer, the term of this patent is extended or adjusted under 35 U.S.C. 154(b) by 538 days.

(21) Appl. No.: 12/526,984

(22) PCT Filed: Mar. 12, 2008

(86) PCT No.: PCT/EP2008/052968
§ 371 (c)(1),
(2), (4) Date: Jan. 13, 2010

(87) PCT Pub. No.: WO2008/113734
PCT Pub. Date: Sep. 25, 2008

(65) Prior Publication Data
US 2010/0133494 A1 Jun. 3, 2010

(30) Foreign Application Priority Data
Mar. 14, 2007 (FR) ...................................... 07 01819

(51) Int. Cl.
*G11C 11/00* (2006.01)

(52) U.S. Cl. ........ 365/148; 365/100; 365/129; 365/158; 365/163

(58) Field of Classification Search .................... 365/46, 365/94, 100, 129, 148, 163, 158; 257/2–5, 257/9, 310, E21.35; 438/95, 96, 135, 166, 438/240, 365, 482, 486, 597, 785
See application file for complete search history.

(56) References Cited

U.S. PATENT DOCUMENTS 4,960,583 A * 10/1990 Rousset et al. ................ 501/127
2005/0029587 A1 2/2005 Harshfield

OTHER PUBLICATIONS

International Search Report dated Apr. 29, 2008.
Shanthu, N., et al., "Electronic Structure of Vacancy Ordered Spinels, GaMo4S8 and GaV4S8, from ab initio calculations," Journal of Solid State Chemistry Academic Press, USA, vol. 148, No. 1, Nov. 15, 1999, pp. 143-149. ABD-Elmeguid, M.M. et al., Transition from Mott Insulator to Superconductor in GaNb4Se8 and GaTa4Se8 under high pressure, Physical Review Letters APS USA, vol. 93, No. 12, Sep. 17, 2004, pp. 1-4.
Chudo, et al., "Magnetic and Structural Transitions of GeV4S8," Physica B. Condensed Matter, Amsterdam, NL, vol. 378-380, May 1, 2006, pp. 1150-1151.
Zeitschrift fur Anorganische and Allgemeine Chemi Huthig-Johann Ambrosius Barth Verlag Germany, vol. 624, 6, Jun. 1998, pp. 952-958.

* cited by examiner

*Primary Examiner* — Richard Elms
*Assistant Examiner* — Harry W Byrne
(74) *Attorney, Agent, or Firm* — Thomas, Kayden, Horstemeyer & Risley, LLP

(57) ABSTRACT

The invention relates to the use of a material that belongs to the class of lacunar spinels with tetrahedral aggregates of an AM4X8 transition element as the active material for an electronic data non-volatile memory, in which: A includes at least one of the following elements: Ga, Ge, Zn; M includes at least one of the following elements: V, Nb, Ta, Mo; and X includes at least one of the following elements: S, Se.

9 Claims, 4 Drawing Sheets

USE OF LACUNAR SPINELS WITH TETRAHEDRAL AGGREGATES OF A TRANSITION ELEMENT OF THE $AM_4X_8$ TYPE WITH AN ELECTRONIC DATA REWRITABLE NON VOLATILE MEMORY, AND CORRESPONDING MATERIAL

CROSS REFERENCE TO RELATED APPLICATION

This application claims priority to "Use of Lacunar Spinels with Tetrahedral Aggregates of a Transition Element of the $AM_4X_8$ Type with an Electronic Data Rewritable Non Volatile Memory, and Corresponding Material," having serial number PCT/EP2008/052968, filed on Mar. 12, 2008. This application also claims priority to and benefit of French Application entitled "Use of Lacunar Spinels with Tetrahedral Aggregates of a Transition Element of the $AM_4X_8$ Type with an Electronic Data Rewritable Non Volatile Memory, and Corresponding Material", having application Ser. No. 07/01819, filed on Mar. 14 2007, which is incorporated by reference in its entirety.

The field of the invention is that of electronic data non-volatile memories. More precisely, the invention relates to a compound forming the active material of an electronic data rewritable non-volatile memory, in particular for storing computer data.

The current technology for non-volatile memories is dominated by "flash" memories, which are used in all consumer applications (digital cameras, USB flash drives, etc.).

These "flash" memories present obstacles with respect to the miniaturisation thereof, these obstacles being related, in particular, to:
 their limited life cycle;
 fast write times (<10 µs);
 the high voltages required (>10 V).

RRAM memories (Resistive Random Access Memory) recently appeared as an alternative solution.

As a matter of fact, RRAM memories are equal to "flash" memories in terms of density and cost, all the while being faster and consuming less.

In RRAM systems, very short electrical pulses (100 ns) generate an easily measurable variation in the resistance ($R_{high} \gg R_{low}$) of a simple device consisting of two electrodes separated by an active material.

Several types of active materials for RRAMs are currently known, including:
 PrCaMnO (or PCMO) better known by the name of "CMR" (Colossal Magnetoresistance);
 NiO;
 $Cu_2O$;
 $TiO_2$.

For $TiO_2$ type memories, a layer of $TiO_2$ is placed between two electrodes. Filaments are created in the material connecting the two electrodes and enable the current to be conducted (low resistance). By applying a voltage to the positive side, a portion of the filaments is oxidized, thereby increasing the resistance of material. Conversely, by way of the Joule effect, the positive side of the filaments is reduced so as to reduce the resistance again.

RRAMs have a very strong potential with regard to the uses of same in the field of computer data storage, but are, however, currently only at the laboratory prototype stage, and are therefore under experimentation.

Certain data is therefore lacking as to their development at an industrial scale.

In particular, the invention has the objective of proposing a new type of RRAM.

More precisely, the objective of the invention is to propose a material usable as an active material for an electronic and/or computer data rewritable non-volatile memory, which has real prospects for industrial use.

In this sense, in particular, the invention has the objective of providing a material which makes it possible:
 to switch a logic element between two states of electrical resistance with low voltages, preferably lower than 0.1 V;
 to obtain switching times between two states which are lower than those of the "flash" type memories of the prior art;
 to increase integration, i.e., to increase the quantity of information stored per unit volume.

These objectives, as well as others which will become apparent hereinbelow, are achieved owing to the invention, which relates to the use of a material belonging to the family of lacunar spinels with tetrahedral aggregates of an $AM_4X_8$ transition element as the active material of an electronic data rewritable non-volatile memory, in which:
 A includes at least one of the following elements: Ga, Ge, Zn;
 M includes at least one of the following elements: V, Nb, Ta, Mo;
 X includes at least one of the following elements: S, Se.

Within the framework of studies carried out on compounds having non-linear current-voltage characteristics, the applicant has indeed surprisingly discovered the existence of a non-volatile resistive transition phenomenon induced by electrical pulses in the family of lacunar spinels with tetrahedral aggregates of an $AM_4X_8$ transition element.

Single crystals of these compounds were synthesized and, after depositing metal electrodes, the application of electrical pulses made it possible to vary the resistance of these materials in a non-volatile and reversible manner; it is thus possible to cycle, at ambient temperature, between two states of high and low resistance. This cycle can be repeated reproducibly and this effect can be used to produce a rewritable non-volatile memory.

The characteristics observed make it possible to anticipate industrial applications for the use of these materials as an active material in RRAM-type memories.

As a matter of fact, as will be shown hereinbelow, a material used according to the invention has the advantages of:
 switching a logic element between two states of electrical resistance with low voltages, preferably lower than 0.1 V;
 obtaining switching times between two states which are lower than those of the "flash" type memories of the prior art;
 increasing integration, i.e., increasing the quantity of information stored per unit volume.

It is noted that, within the scope of the invention, an "active material" is understood to mean a material capable of having two distinct states, in particular resistive states, under the application of electrical pulses.

According to a preferred application, said material is placed between two metal electrodes, said material between said two metal electrodes advantageously forming a binary information bit.

Such a structure thus makes it possible to form an information bit having two states, one having high resistance and the other having low resistance, which can be considered as logics 0 and 1, thereby enabling the information to be stored in the binary logic conventionally used in the field of computer memories.

In addition, such a structure contributes to increasing the quantity of information stored per unit volume, the geometry of such a structure being significantly simpler than that used in "flash" memories, thereby enabling the size of each bit to be reduced.

Additionally, according to one advantageous approach of the invention:

$A=Ga_{1-x-y}Ge_xZn_y$, where $0 \leq x+y \leq 1$, with $0 \leq x \leq 1$ and $0 \leq y \leq 1$;

$M=V_{1-\alpha-\beta-\gamma}Nb_\alpha Ta_\beta Mo_\gamma$, where $0 \leq \alpha+\beta+\gamma \leq 1$, with $0 \leq \alpha \leq 1$, $0 \leq \beta \leq 1$ and $0 \leq \gamma \leq 1$;

$X=S_{1-\nu}Se_\nu$, where $0 \leq \nu \leq 1$.

According to various advantageous embodiments:

$x=0$, $y=0$, $\beta=1$, $\nu=1$.
$x=0$, $y=0$, $\alpha=0$, $\beta=0$, $\gamma=0$, $\nu=0$.
$x=0$, $y=0$, $\alpha=1$, $\nu=1$.
$x=0$, $y=0$, $\alpha=0$, $\beta=0$, $\gamma=0$, $\nu=1$.
$x=1$, $\alpha=0$, $\beta=0$, $\gamma=0$, $\nu=0$.

Other characteristics and advantages of the invention will become more apparent upon reading the following description of several embodiments of the invention, given for illustrative and non-limiting purposes, and from the appended drawings, in which.

As indicated previously, the principle of the invention is based on the use of a material belonging to the family of lacunar spinels with tetrahedral aggregates of an $AM_4X_8$ transition element as the active material of an electronic data rewritable non-volatile memory.

More precisely, A, M and X are characterised in the following way:

A includes at least one of the following elements: Ga, Ge, Zn;

M includes at least one of the following elements: V, Nb, Ta, Mo;

X includes at least one of the following elements: S, Se.

In recent years, a research project was undertaken by the applicant in the field of materials having very strong electrical current-voltage non-linearities.

These effects of electrical current-voltage non-linearities were demonstrated at low temperatures in the incommensurable 2D compound $(LaS)_{1.195}VS_2$, with a drop in resistivity of more than five orders of magnitude (CER effect).

However, despite the presence of hysteresis, no non-volatile effect is observed in $(LaS)_{1.195}VS_2$.

Structurally speaking, this compound is characterised by an unusual modulation of the distances V-V: the shortest ones define clusterised fragments of vanadium.

In addition, work carried out in parallel showed that this compound is close to the Mott insulating state.

Therefore, by hypothesizing a possible link between the CER effect, the proximity of the Mott insulating state and the existence of triangular aggregates of vanadium, the properties of the compound $GaV_4S_8$ were explored. This lacunar spinel has regular tetrahedrons of vanadium which are isolated from one another.

The existence of a CER effect in this compound was discovered.

However, an even more remarkable fact is that the applicant discovered that this CER effect is non-volatile.

The various work projects demonstrating the properties of these materials are described below.

Figures 1, 2:
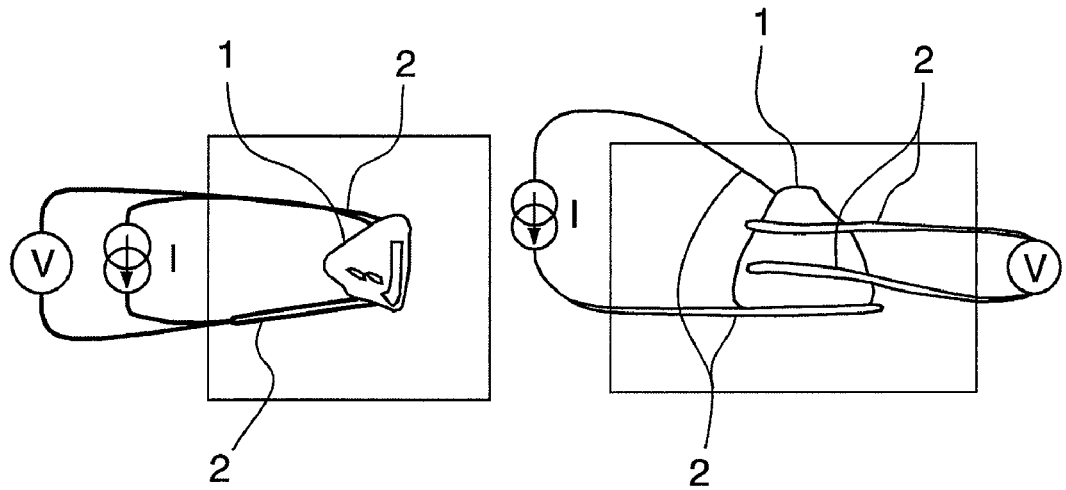
FIGS. 1 and 2 are each a view of an electrical connection diagram at the current sources and voltmeters of single crystals of a material according to the invention, in "two-contact" mode and "four-contact" mode, respectively.

With reference to FIGS. 1 and 2, single crystals 1 of the isostructural compounds $AM_4X_8$ having typical dimensions of 300 μm×300 μm×300 μm were synthesized.

Silver, gold or carbon electrodes 2 were next positioned on these single crystals 1 so as to create electrical connections to a current source and a voltmeter.

The resulting device operates in "two-contact" mode (FIG. 1). The "four-contact" mode (FIG. 2) was likewise produced so as to verify that the switching property is intrinsic to the material and is not related to an interface effect between the electrodes and the material.

Figure 3:
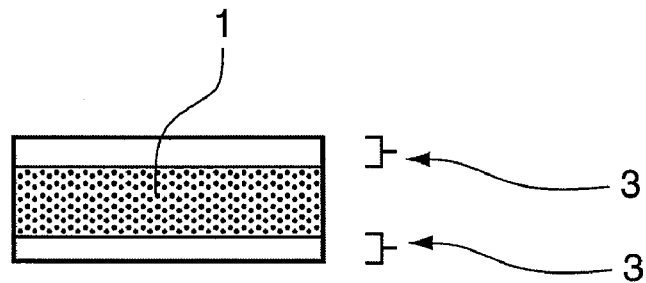
FIG. 3 is a schematic representation of a component forming an information bit and including an active material according to the invention.

A preferred alternative for applying the invention to the field of microelectronics relates to the deposition of a thin layer (the thickness of which is of the order of a few tens of nm) of $AM_4X_8$ materials. A relevant geometry is of the "MIM" type (metal-insulator-metal) in which the $AM_4X_8$ material is sandwiched between two metal electrodes 3 (FIG. 3).

It is noted that the component thus formed can advantageously comprise an information bit having two states, one having high resistance and the other having low resistance, which can be considered as logics 0 and 1, thereby enabling the information to be stored in binary logic.

Figure 4:
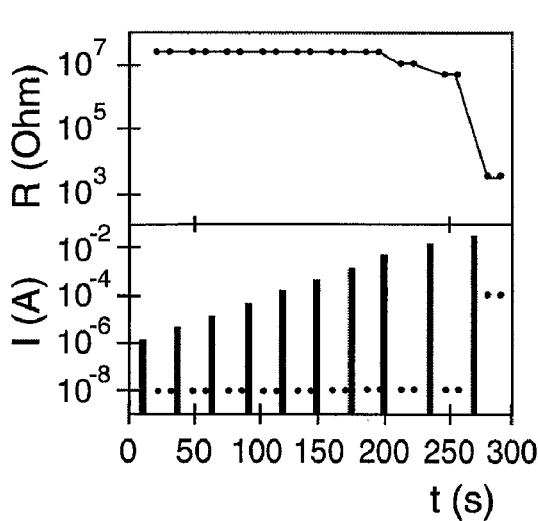
FIG. 4 is an illustration of the protocol used to switch a material according to the invention.

A series of electrical pulses of increasing intensity I were applied to a sample, the electrical resistance R thereof having been measured after each pulse, by applying the protocol shown in FIG. 4.

The purpose of this protocol is to switch the sample from a high-resistance state (≈30 MΩ) to a low-resistance state (≈3 kΩ).

The measurement was carried out at 85 K in "four-contact" mode (FIG. 2) on the compound $GaV_4S_8$.

Figure 5:
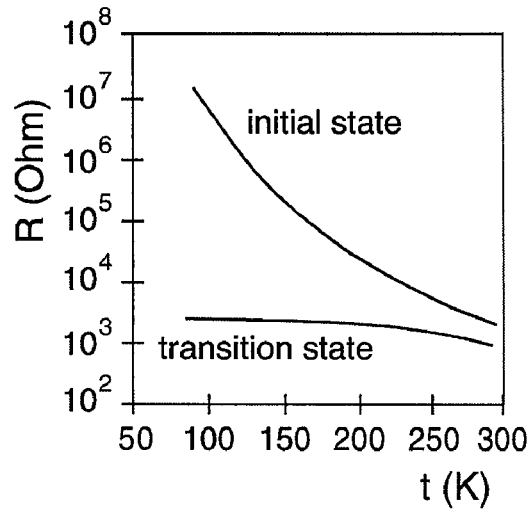
FIG. 5 is a graph of the measurement curves obtained using the protocol shown in FIG. 4.

FIG. 5 is a record of measurements of the electrical resistance of the sample in relation to the temperature in the initial high-resistance state and in the low-resistance transition state.

Therefore, it is observed that, for low-intensity pulses (between 1 μA and 3 mA), the measured post-pulse resistance (≈30 MΩ) does not vary (volatile transition).

On the other hand, starting from a threshold intensity, the measured post-pulse electrical resistance of GaV4S8 drops sharply to 3 kΩ.

This non-volatile behaviour, the observation of which was unexpected at the start of research, appears in GaV4S8 as well as in GaTa4Se8, GeV₄Se₈, GaV₄Se₈ and GaNb₄Se₈, as shown in FIGS. 10 to 14.

The low-resistance transition state is non-volatile and retains the properties thereof for several hours: as a matter of fact, it was observed that the resistance curve for the transition state was reproducible at the rise in temperature and at the fall in temperature.

It is noted that the values for x, y, α, β, γ, ν can assume values intermediate between 0 and 1.

Figure 15:
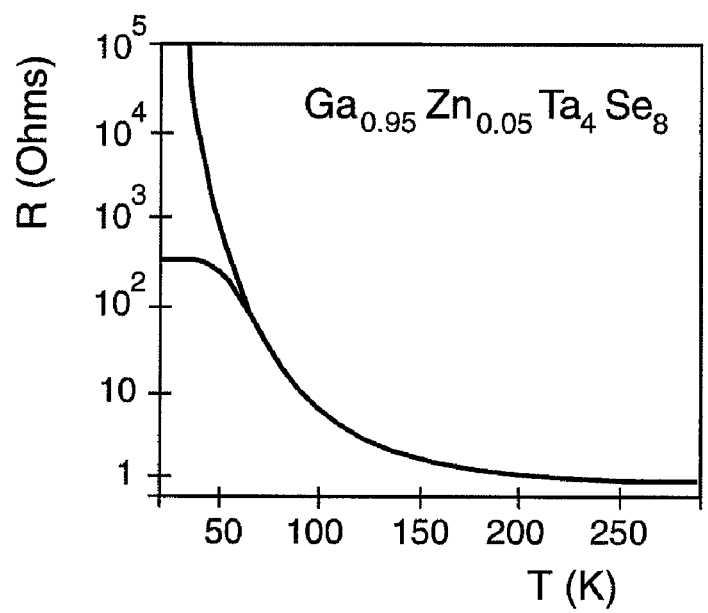
Figure 16:
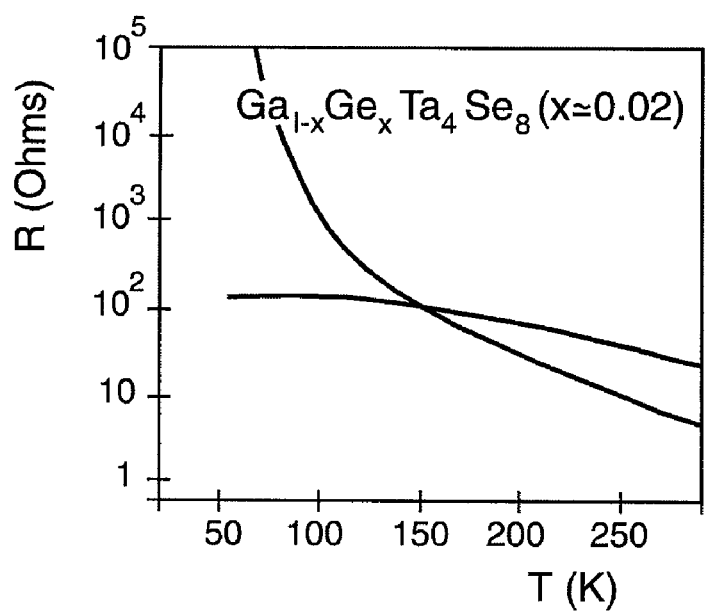

Thus, for element A of AM₄X₈, the latter can be in the form of:

$Ga_{0.95} Zn_{0.05}$, with, for example, M=Ta and X=Se, $Ga_{1-x} Ge_x$, (with x equal to approximately 0.02), with, for example, M=Ta and X=Se FIGS. 15 and 16 show the non-volatile behaviour of these materials.

In addition, it is noted that other alternative embodiments of the AM₄X₈ material can be anticipated, the latter being more broadly definable as follows:

$A=Ga_{1-x-y}Ge_xZn_y$, where $0 \times x+y \leq 1$, with $0 \leq x \leq 1$ and $0 \leq y \leq 1$;

$M=V_{1-\alpha-\beta-\gamma}Nb_\alpha Ta_\beta Mo_\gamma$, where $0 \leq \alpha+\beta+\gamma \leq 1$, with $0 \leq \alpha \leq 1$, $0 \leq \beta \leq 1$ and $0 \leq \gamma \leq 1$;

$X=S_{1-\nu}Se_\nu$, where $0 \leq \nu \leq 1$.

Figure 6:
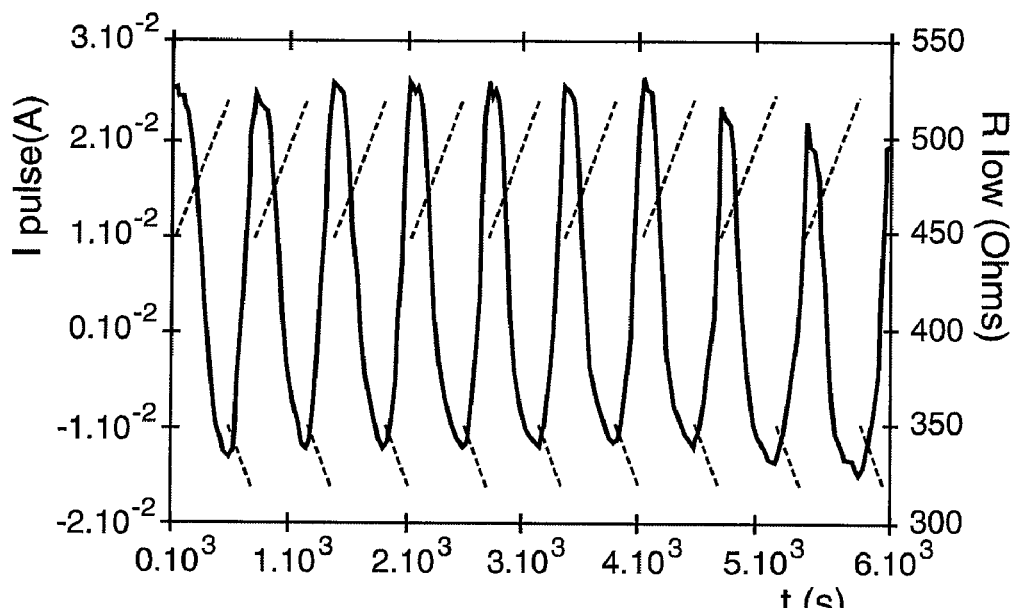
FIG. 6 is a graph of curves of measurements carried out on a material according to the invention, showing cycling between the initial and transition state of the material.

FIG. 6 shows that it is possible to cycle, at ambient temperature, between high- and low-resistance states.

After having caused the electrical resistance of a sample of GaV₄Se₈ to drop under the effect of pulses of increasing intensity (between 10 and 24 mA), the direction of the current of the following pulses was reversed (between −10 and −17 mA). The electrical resistance then rises again to return to the initial high resistance.

This cycle was repeated several times with a good degree of reproducibility, as shown clearly in FIG. 6.

As shown in FIG. 5, the low-resistance "transition" state has a different nature from the initial high-resistance state.

In particular, the temperature dependences of the resistance in the two states are very different.

The temperature dependence of the resistance in the initial state is characteristic of an insulator with activation energies of approximately 0.1 eV.

For the transition state, at a high temperature, a dependence characteristic of an insulator is observed, and then, at temperatures lower than 100K (variable depending on the sample), a resistance is observed, which varies very slightly in temperature.

Figure 9:
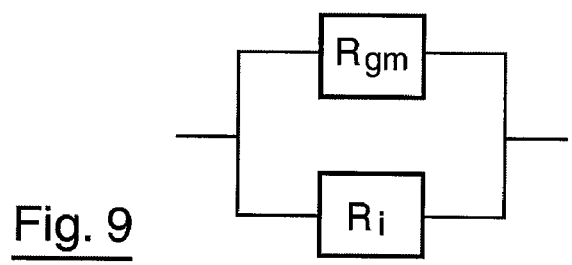
FIG. 9 is a schematic representation of a model having two conductances, which is used to model the measurements shown in FIG. 8.
Figure 10:
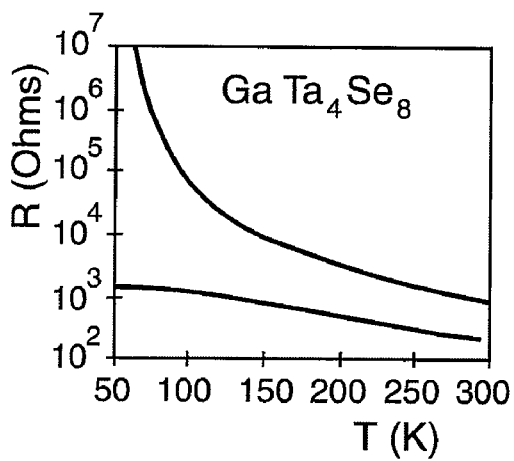
FIGS. 10 to 16 are graphs of measures of the non-volatile Colossal Electro-Resistance Effect (CER) carried out on various materials according to the invention.
Figure 11:
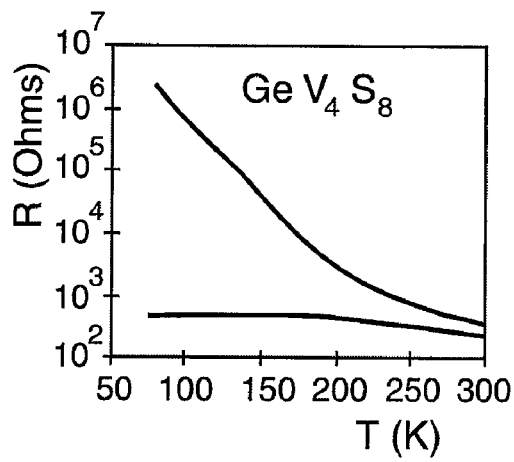
Figure 12:
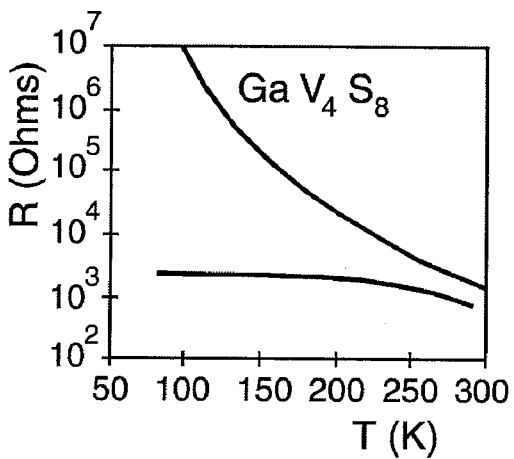
Figure 13:
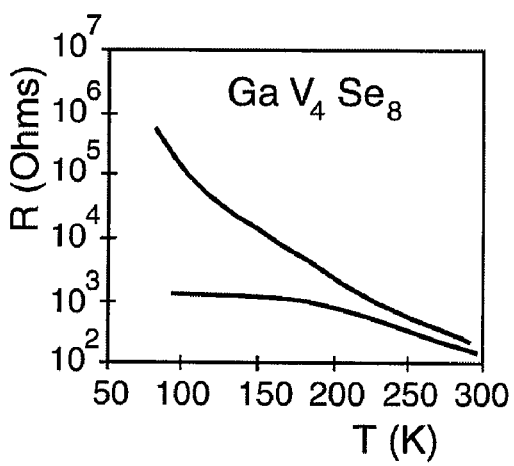
Figure 14:
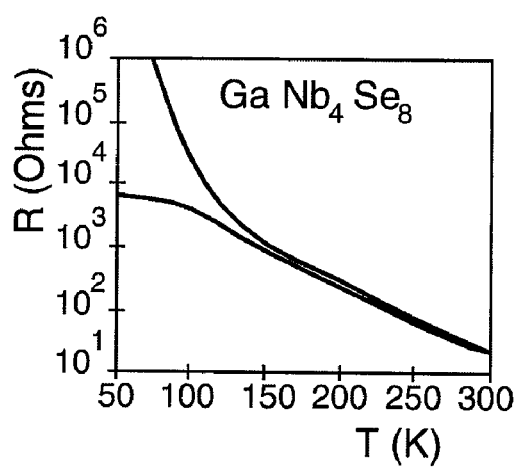

This behavioural change suggests a transmission of electricity via two fluids, and the previously obtained data was modelled from a model having two conductances, as shown schematically in FIG. 9.

This model consists of a parallel circuit consisting of an insulator-type resistance $R_i$, on the one hand, and a granular metal-type resistance $R_{gm}$, on the other hand.

Figure 7:
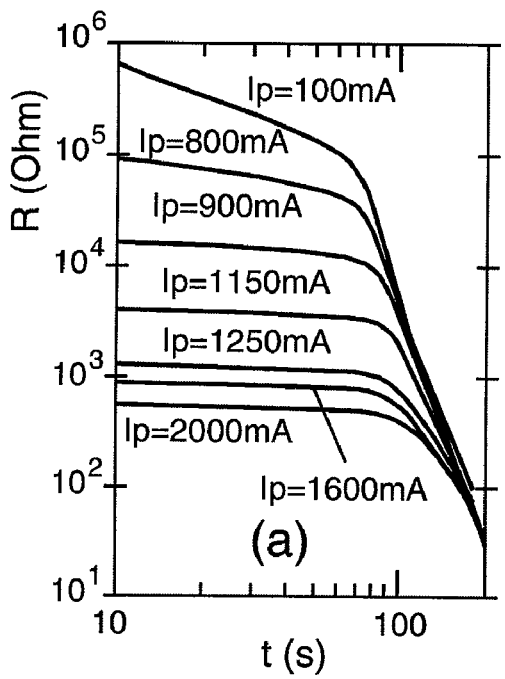
FIG. 7 is a graph of curves of measurements carried out on a material according to the invention, showing various low-resistance states measured after application of various electrical pulses.
Figure 8:
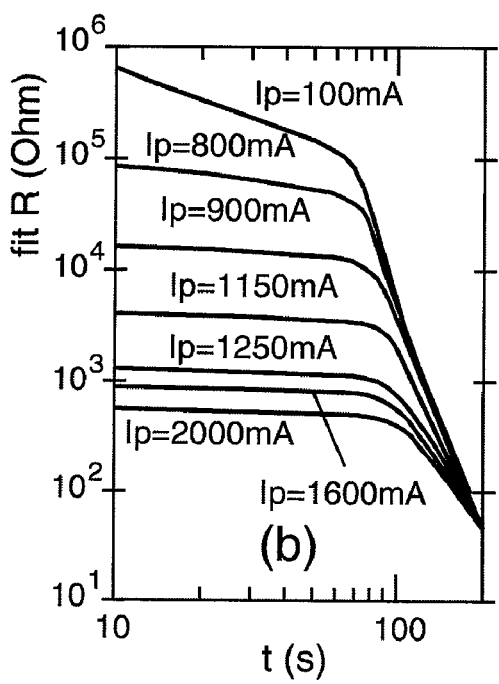
FIG. 8 is a modelling graph of the measurements of FIG. 7.

FIG. 8 shows that the experimental curves shown in FIG. 7, which show various low-resistance states measured after applying pulses of increasing intensity ranging from 100 mA to 2A, on a crystal consisting of GaTa4Se8, were very satisfactorily reproduced from this model.

Therefore, this model indicates that the electrical pulses generate an electronic phase separation with creation/reorganisation of metal islands bathed in an insulating matrix.

The invention claimed is:

1. Use of a material belonging to the family of lacunar spinets with tetrahedral aggregates of an AM₄X₈ transition element as the active material of an electronic data rewritable non-volatile memory, in which:

A includes at least one of the following elements: Ga, Ge, Zn;

M includes at least one of the following elements: V, Nb, Ta, Mo;

X includes at least one of the following elements: S, Se.

2. Use of a material of claim 1, characterised in that said material is placed between two metal electrodes.

3. Use of a material of claim 2, characterised in that said material between said two metal electrodes forms a binary information bit.

4. Use of a material as claimed in any of claim 1, characterised in that:

$A=Ga_{1-x-y}Ge_xZn_y$, where $0 \leq x+y \leq 1$, with $0 \leq x \leq 1$ and $0 \leq y \leq 1$;

$M=V_{1-\alpha-\beta-\gamma}Nb_\alpha Ta_\beta Mo_\gamma$, where $0 \leq \alpha+\beta+\gamma \leq 1$, with $0 \leq \alpha \leq 1$, $0 \leq \beta \leq 1$ and $0 \leq \gamma \leq 1$;

$X=S_{1-\nu}Se_\nu$, where $0 \leq \nu \leq 1$.

5. Use of a material of claim 4, characterised in that X=O, y=0, β=1, ν=1.

6. Use of a material of claim 4, characterised in that x=0, y=0, α=0, β=0, γ=0, ν=0.

7. Use of a material of claim 4, characterised in that x=0, y=0, α=1, ν=1.

8. Use of a material of claim 4, characterised in that x=0, y=0, α=0, β=0, γ=0, ν=1.

9. Use of a material of claim 4, characterised in that x=1, α=0, β=0, γ=0, ν=0.

* * * * *